United States Patent
Albert et al.

(10) Patent No.: US 12,316,321 B2
(45) Date of Patent: May 27, 2025

(54) CIRCUIT ASSEMBLY AND METHOD FOR CONTROLLING THE OPERATING STATE OF A CIRCUIT

(71) Applicant: Preh GmbH, Bad Neustadt a.d. Saale (DE)

(72) Inventors: Mirco Albert, Bad Kissingen (DE); Andre Ress, Roemhild (DE); Tim Scholz, Schweinfurt (DE)

(73) Assignee: Preh GmbH, Bad Neustadt a.d. Saale (DE)

( * ) Notice: Subject to any disclaimer, the term of this patent is extended or adjusted under 35 U.S.C. 154(b) by 140 days.

(21) Appl. No.: 18/348,164

(22) Filed: Jul. 6, 2023

(65) Prior Publication Data

US 2024/0014808 A1    Jan. 11, 2024

(30) Foreign Application Priority Data

Jul. 7, 2022    (DE) .................. 10 2022 116 987.1

(51) Int. Cl.
*H03K 3/01*    (2006.01)
*H03K 3/012*   (2006.01)
*H03K 17/56*   (2006.01)

(52) U.S. Cl.
CPC ............. *H03K 3/012* (2013.01); *H03K 17/56* (2013.01)

(58) Field of Classification Search
CPC .... G06F 1/3206; G06F 1/3209; G06F 1/3287; H03K 17/56; H03K 3/012
See application file for complete search history.

(56) References Cited

U.S. PATENT DOCUMENTS

| | | | |
|---|---|---|---|
| 11,093,018 B2 | 8/2021 | Yu et al. | |
| 2009/0306974 A1* | 12/2009 | Huang | H04L 5/1415 704/211 |
| 2013/0147526 A1* | 6/2013 | Kim | G06F 1/08 327/114 |
| 2022/0066612 A1* | 3/2022 | Xiao | G06F 3/04166 |

FOREIGN PATENT DOCUMENTS

| | | |
|---|---|---|
| DE | 102011084963 A1 | 4/2013 |
| WO | 2015183268 A1 | 12/2015 |

OTHER PUBLICATIONS

German Office Action for DE 10 2022 116 987.1, dated May 4, 2023. German Patent and Trade Mark Office, Munich Germany.

* cited by examiner

*Primary Examiner* — Quan Tra
*Assistant Examiner* — Anh-Quan Tra
(74) *Attorney, Agent, or Firm* — M&B IP Analysts, LLC (57) ABSTRACT

A circuit assembly and a method for controlling operation states The circuit can be shifted by idle signals from the active operation state into the idle state and can be shifted by wake-up signals in an edge-triggered manner from the idle state into the active operation state if the wake-up signal executes a change in potential from a non-activation potential to an activation potential. The wake-up signals are supplied to a wake-up signal input of the circuit with the interposition of a masking circuit, which passes through the wake-up signals to the wake-up signal input in the idle state of the circuit and, in the active operation state of the circuit, applies to the wake-up signal input a predetermined electric masking potential, from which a change in potential towards the activation potential of the wake-up signal shifts the circuit from the idle state into the active operation state.

15 Claims, 3 Drawing Sheets

CIRCUIT ASSEMBLY AND METHOD FOR CONTROLLING THE OPERATING STATE OF A CIRCUIT

The present disclosure relates to a circuit assembly and to a method for controlling the operation state of a circuit, e.g. an integrated circuit, which can be selectively operated in an active operation state and an idle state, which is reduced in consumption compared to the former.

For an energy-efficient operation, it is customary today to configure circuits, particularly integrated circuits (IC), with different operation modes, which include a normal, active operation state in which the circuit provides its full intended function, and an idle state contrasting the active operation state, in which the energy consumption of the circuit is considerably reduced compared with the active operation state. One, or even several, intermediate states may also be provided for operating the circuit, in which the circuit respectively only provides a predetermined part of its intended functions, for instance, whereby a reduction of the energy consumption can already be attained compared with the normal, fully active operation state. In the idle state, maximum energy savings can be provided by switching off all electrical functional units of the circuit not required, i.e. making them currentless. In that case, the circuit only requires energy for maintaining a monitoring function which recognizes a request for reactivation that wants to cause the departure from the idle state and a change into the or one of the possible operation modes.

The reactivation of the circuit usually takes place by means of a predetermined wakeup signal supplied to a wake-up signal input of the circuit. If the reactivation takes place in an edge-triggered manner, i.e. a rising or falling edge of the wake-up signal causes the reactivation, it is essential that a corresponding change in potential of the wake-up signal be reliably detected by the circuit. If this change in potential is not detected, the electrical potential reached after the change in potential is no longer capable of causing the edge-triggered reactivation of the circuit.

In certain applications, it is possible that, e.g. subsequent to a request to the circuit to assume its idle state, a reliable monitoring at the wake-up signal input cannot take place for a short time-span, which may amount to a few milliseconds, for instance. If a reactivation request is sent to the circuit by means wake-up signal in such a state, it may happen that this request is not recognized. The circuit assumes the idle state although this is no longer intended. Such operation states may be promoted considerably by non-synchronized wake-up and idle requests. Depending on the application and connection of the circuit, e.g. to further circuits of an application circuit, interdependencies between the circuits may result in a situation of mutual blocking, which possibly can only be removed by fully disconnecting the circuit or the application circuit from the current. Switching off the energy supply may possibly require a lot of effort, or may even be impossible to carry out for a normal user. It is therefore desirable to securely and reliably avoid such blocked states.

Against this background, the present disclosure is based on the object of providing a circuit assembly and a method for controlling the operation state of a circuit that can be selectively operated in an active operation state and an idle state reduced in consumption compared to the former, which ensure a secure and reliable recognition of a wake-up request under all conceivable operation conditions of the circuit with a simple design—in particular, compact, few components, inexpensive.

This object is accomplished by a circuit assembly having the features of claim 1 and a method having the features of claim 8. Other particularly advantageous embodiments of the present disclosure are disclosed by the respective dependent claims.

It must be noted that the features cited individually in the claims can be combined with each other in any technologically meaningful manner (also across the boundaries of categories, such as method and device) and represent other embodiments of the present disclosure. The description, in particular in connection with the Figures, additionally characterizes and specifies the present disclosure.

It may also be noted that a conjunction "and/or" used hereinafter, which is situated between two features and links them to each other, should always be interpreted such that, in a first embodiment of the subject matter according to the present disclosure, only the first feature may be provided, in a second embodiment, only the second feature may be provided, and in a third embodiment, both the first and the second feature may be provided.

Further, a term "about" used herein is supposed to specify a tolerance range which the person skilled in the art working in the present field considers to be common. In particular, the term "about" is to be understood to mean a tolerance range of the quantity concerned of up to a maximum of +/−20%, preferably up to a maximum of +/−10%.

According to the present disclosure, a circuit assembly is provided for controlling the operation state of a circuit, in particular an integrated circuit (IC), for example, wherein the circuit can selectively be operated in an active operation state and an idle state, which is reduced in consumption compared to the former, wherein the circuit can be shifted by means of at least one idle signal from the active operation state into the idle state and can be shifted by means of at least one wake-up signal in an edge-triggered manner from the idle state into the active operation state if the wake-up signal executes a change in potential from a non-activation potential to an activation potential. According to the present disclosure, the at least one wake-up signal is supplied to a wake-up signal input of the circuit with the interposition of a masking circuit, which passes through the at least one wake-up signal to the wake-up signal input in the idle state of the circuit and, in the active operation state of the circuit, applies to the wake-up signal input a predetermined electric masking potential, from which a change in potential towards the activation potential of the wake-up signal shifts the circuit from the idle state into the active operation state.

In other words, the masking circuit masks the wake-up signal at the wake-up signal input of the circuit with the predetermined masking potential while the circuit is not in the idle state. It is thus ensured that the circuit reliably does not miss any wake-up request during a change into the idle state. If the circuit cannot reliably guarantee a monitoring of the edge-triggered wake-up signal input for a short period of time, i.e. for some milliseconds up to one or a few seconds, and if during this time a wake-up request is signaled by the wake-up signal when there is a change of the operation state into the idle state, the masking circuit forwards the signaling edge of the wake-up request to the wake-up signal input when the circuit has assumed the idle state. In this operation state, the circuit recognizes the wake-up request and consequently reliably leaves the idle state in order to reassume operation. This is possible because the masking circuit, during the operation phases of the circuit with the exception of the idle state, masks the wake-up signal with the masking potential which, according to the present disclosure, is chosen such that a change in potential from the masking potential towards an activation potential reliably generates the signal edge, which activates the edge-triggered wake-up function of the circuit.

The present disclosure thus ensures that the circuit is always in a defined operation state corresponding to the respective application. Possible blocking states, which may arise as a consequence of dependencies of the circuit on possible other circuits of an application circuit, for instance, are securely and reliably prevented. In particular, it is prevented that the circuit changes into the idle state and in the meantime misses a wake-up request, which results in the circuit erroneously remaining in its idle state and consequently ceasing operation.

It is to be understood that the non-activation potential and the activation potential of the wake-up signal for generating the signal edge triggering the wake-up function may basically be arbitrary electrical potentials if they differ from one another sufficiently for the edge-triggered state change of the circuit. For example, the non-activation potential may be smaller than the activation potential, however, it may also be greater than the activation potential. In the former case, the change in potential thus results in a rising edge of the wake-up signal, in the latter case to a falling edge.

An integrated circuit (IC) is to be understood to be an electronic circuit applied to a thin plate of semiconductor material, most frequently with a size of a few millimeters. For protection and easier contacting, a chip is usually encapsulated in a chip housing several times its size. An IC typically contains a combination of numerous electrically interconnected electronic semiconductor components, such as transistors, diodes and/or further active and passive components.

If reference is made hereinafter to a circuit, particularly an integrated circuit, according to the present disclosure, it can be configured identically at least with regard to the features according to the present disclosure unless otherwise stated, i.e. be capable of being operated in an active operation state and an idle state and/or have a wake-up signal input and/or provide an edge-triggered wake-up function, for instance.

An advantageous embodiment of the subject matter of the present disclosure provides that the masking circuit has a control input, via which the passing-through of the wakeup signal and the application of the masking potential is selectively controlled by means of a control signal, wherein the at least one control signal is configured and wired to generate the control signal and supply it to the control input of the masking circuit. In other words, the circuit in this case independently generates the control signal depending on its current operation state, with which the control signal is then always synchronized.

In principle, it is also conceivable to supply the masking circuit with the control signal also from another signal source, which knows or reliably monitors the current operation state of the circuit and generates the control signal accordingly.

According to another advantageous embodiment of the present disclosure, the circuit assembly has at least one further circuit, e.g. another integrated circuit (IC), to which the control signal for controlling the masking circuit is supplied. Here, the control signal is designed to supply the at least one further circuit with electrical energy for an operation as intended. In the present case, the control signal constitutes an electric power supply for the at least one further circuit. Thus, it is easily possible to control the operation state or states of the at least one further circuit depending on the operation state of the at least one circuit. Preferably, the control signal provides in the active operation state of the at least one circuit an active energy supply for the at least one further circuit; in contrast, the energy supply provided by the control signal is ceased in the idle state of the at least one circuit. Thus, the current consumption of the circuit assembly comprising several circuits can be maximally reduced.

According to yet another advantageous embodiment, the circuit assembly comprises at least one further circuit, in particular an integrated circuit (IC), to which the control signal for controlling the masking circuit is supplied at its wake-up signal input, wherein the control signal is generated and provided by a different circuit from that to which the control signal is supplied. The at least one further circuit may be configured substantially like the at least one (first) circuit, i.e. have at least one wake-up signal input and provide an edge-triggered wake-up function.

In another advantageous embodiment of the present disclosure, the circuit assembly includes at least one further circuit, in particular an integrated circuit (IC), which is configured and wired to generate, depending on its operation state, an operation state signal and supply it to the masking circuit as a wake-up signal. The at least one further circuit may be configured substantially like the at least one (first) circuit, i.e. be capable of being operated in an active operation state and a consumption-reduced idle state. Preferably, the operation state signal of the further circuit has the non-activation potential of the wake-up signal when the further circuit is in the idle state, and otherwise the activation potential of the wake-up signal (i.e. in the active operation state). It is thus additionally ensured that an active operation state of a further circuit interrupts or prevents an idle state of the at least one (first) circuit. In this case, the at least one further circuit can be put into the idle state first, in an ordered manner, before the at least one (first) circuit changes into the idle state.

On the input side, the masking circuit can be supplied with several parallel wake-up signals, each from different signal sources.

According to yet another advantageous embodiment of the present disclosure, which permits a particularly simple structure with few components, the masking circuit has, for passing through the wake-up signal to the wake-up signal input of the circuit and for applying the masking potential to the wake-up signal input, a diode component which is connected on the output side to the wake-up signal input and connected on the input side to a switched terminal of a transistor component controlled by means of the control signal, which provides either the wake-up signal or the masking potential at the switched terminal. A switched terminal of the transistor component, which may be configured as a bipolar transistor or MOSFET transistor, is understood to be a collector, emitter or source or drain terminal. In contrast, a base or gate terminal of the transistor component is to be considered a control terminal (i.e. not as a switched terminal).

In another advantageous embodiment of the present disclosure, which can also be constructionally realized without any great effort with respect to components and costs, the masking circuit has, for passing through the at least one wake-up signal to the wake-up signal input of the circuit and for applying the masking potential to the wakeup signal input, a first transistor component (e.g. a bipolar or MOSFET transistor), whose switched output terminal is connected to the wake-up input, and to which the at least one wake-up signal is supplied at a switched input terminal, and which is connected on the control side to a switched terminal of a second transistor component (e.g. a bipolar or MOSFET transistor) controlled by means of the control signal, which provides either the wake-up signal or the masking potential at the switched terminal. Also in this case, the switched terminals of the respective transistor component are to be understood to be a collector, emitter or source or drain terminal, wherein a base or gate terminal are considered control terminals, and thus not switched terminals. Substantially, this embodiment differs from the previous embodiment with the diode component in that the diode component is replaced by a transistor component in the present case.

According to another aspect of the present disclosure, a method is provided for controlling the operation state of a circuit, in particular an integrated circuit (IC), wherein the circuit is selectively operated in an active operation state and an idle state, which is reduced in consumption compared to the former, wherein the circuit is shifted by means of at least one idle signal from the active operation state into the idle state and is shifted by means of at least one wake-up signal in an edge-triggered manner from the idle state into the active operation state if the wake-up signal executes a change in potential from a non-activation potential to an activation potential, wherein the at least one wake-up signal is supplied to a wake-up signal input of the circuit with the interposition of a masking circuit, which passes through the at least one wake-up signal to the wake-up signal input in the idle state of the circuit and, in the active operation state of the circuit, applies to the wake-up signal input a predetermined electric masking potential, from which a change in potential towards the activation potential of the wakeup signal shifts the circuit from the idle state into the active operation state.

It is noted that, with regard to method-related definitions of terms and the effects and advantages of features of the method, reference may made in full to the disclosure of corresponding definitions, effects and advantages of the circuit assembly according to the present disclosure and vice versa. This means that disclosures contained herein regarding the circuit assembly according to the present disclosure may also be used, mutatis mutandis, for defining the method according to the present disclosure unless expressly excluded herein. Also, disclosures contained herein regarding the method according to the present disclosure may be used, mutatis mutandis, for defining the circuit assembly according to the present disclosure unless also expressly excluded herein. Thus, a repetition of explanations of features that are basically the same, their effects and advantages may be largely omitted herein for the sake of a more compact description, without such omissions having to be interpreted as limitations for the respective subject matter of the present disclosure.

According to an advantageous embodiment of the present disclosure, the passing-through of the wake-up signal and the application of the masking potential is controlled by means of a control signal which is supplied to a control input of the masking circuit, wherein the control signal is generated by the at least one circuit and supplied to the control input of the masking circuit.

Furthermore, another advantageous embodiment of the subject matter of the present disclosure provides that the control signal is supplied to at least one further circuit, in particular an integrated circuit, in order to supply it, from the control signal, with electrical energy for an operation as intended. It is to be understood that the control signal is designed for providing the corresponding electrical energy (i.e. voltage, current, power) in order to reliably operate the at least one further circuit.

In yet another embodiment of the present disclosure, the control signal is supplied to the wake-up signal input of at least one further circuit, in particular an integrated circuit, wherein the control signal is generated by a different circuit from that to which the control signal is supplied.

Yet another advantageous embodiment provides that an operation state signal is generated by at least one further circuit, in particular an integrated circuit, depending on its operation state, which is supplied to the masking circuit as a wake-up signal. Also in the present case, the operation state signal of the further circuit preferably has the non-activation potential of the wake-up signal when the further circuit is in the idle state, and otherwise the activation potential of the wake-up signal (i.e. in the active operation state).

On the input side, the masking circuit can be supplied with several parallel wake-up signals, each from different signal sources.

Also preferably, the at least one wake-up signal and the masking potential can be selectively passed through to the wake-up signal input of the circuit via a diode component which is connected on the output side to the wake-up signal input, and to which either the wake-up signal or the masking potential is supplied on the input side via a switched terminal of a transistor component (e.g. a bipolar or MOSFET transistor) controlled by means of the control signal.

Another advantageous embodiment of the subject matter of the present disclosure provides that the at least one wake-up signal and the masking potential are selectively passed through to the wake-up signal input of the circuit via a first transistor component (e.g. a bipolar or MOSFET transistor), whose switched output terminal is connected to the wake-up input, and to which the at least one wake-up signal is supplied at a switched input terminal, and to which either the wake-up signal or the masking potential is supplied on the control side via a switched terminal of a second transistor component (e.g. a bipolar or MOSFET transistor) controlled by means of the control signal.

A preferred use of a circuit assembly according to the embodiments disclosed herein is considered to be with a communication bus of a vehicle, wherein the at least one circuit is communicatively connected as a bus subscriber to the communication bus and can be shifted by means of at least one idle signal from the active operation state into the idle state and can be shifted by means of at least one wake-up signal in an edge-triggered manner from the idle state into the active operation state, wherein the at least one idle signal and the at least one wake-up signal have a switched ignition start signal of the vehicle and/or a predetermined bus message.

Other advantages and features of the present disclosure become apparent from the following description of example embodiments of the present disclosure, which shall be understood not to be limiting and which will be explained below with reference to the drawing. In this drawing, the Figures schematically show.

In the various figures, parts that are equivalent with respect to their function are always provided with the same reference numerals, so that they are also only described once, as a rule.

Figure 1:
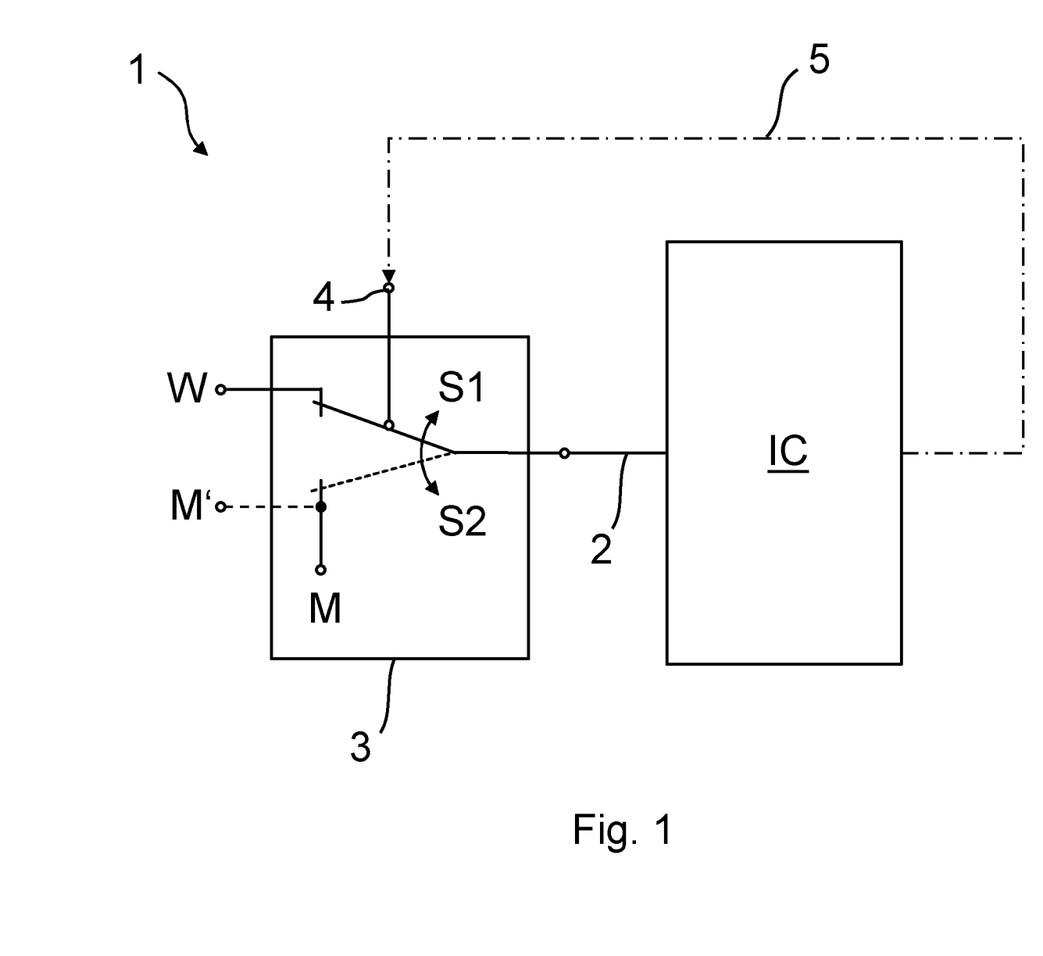
FIG. 1 a block circuit diagram of an exemplary embodiment of a circuit assembly for controlling the operation state of a circuit according to an embodiment, FIG. 2 a block circuit diagram of another exemplary embodiment of a circuit assembly for controlling the operation state of a circuit according to an embodiment, and FIG. 3 a block circuit diagram of yet another exemplary embodiment of a circuit assembly for controlling the operation state of a circuit according to an embodiment.

FIG. 1 schematically shows a block circuit diagram of an exemplary embodiment of a circuit assembly 1 for controlling the operation state of a circuit IC according to an embodiment. In the present example, the circuit IC is configured as an integrated circuit without, however, being strictly limited thereto. Non-integrated circuits are also comprised by the invention if the circuit can be selectively operated in an active operation state and in an idle state, which is reduced in consumption compared to the former, which here is also the case for the exemplary integrated circuit IC.

On the one hand, a change of the operation state can take place by means of at least one idle signal (not shown), which shifts the circuit IC from the active operation state into the idle state. On the other hand, the circuit can be shifted in an edge-triggered manner from the idle state into the active operation state by means of at least one wake-up signal W if the wake-up signal W executes a change in potential from a non-activation potential to an activation potential. I.e., the signal edge of the wake-up signal W, which is generated by the change in potential and which may be rising or falling, is recognized at a wake-up signal input 2 of the circuit IC by the latter. Consequently, the circuit IC changes its operation state from the idle state into the active operation state (or possibly one of several active operation states; not shown).

According to FIG. 1, in the circuit assembly 1 according to an embodiment, the at least one wake-up signal W is supplied to the wake-up signal input 2 of the circuit IC with the interposition of a masking circuit 3. As can be seen in FIG. 1, the masking signal 3 passes through the at least one wake-up signal W to the wake-up signal input 2 in the idle state S1 of the circuit IC. In the active operation state of the circuit IC, the masking circuit 3 in contrast applies a predetermined electric masking potential to the wake-up signal input 2. In this case, the masking potential M is chosen such that, from the masking potential M, a change in potential towards the activation potential of the wakeup signal W always shifts the circuit IC from the idle state into the active operation state.

The switching position of a switching element symbolically shown in FIG. 1 of the masking circuit 3 is labeled S1 and S2, wherein S1 marks the switching state of the masking circuit 3 in the idle state of the circuit IC, and S2 marks the switching state of the masking circuit 3 in the active operation state of the circuit IC.

Further, it can be seen in FIG. 1 that in the present case, the predetermined masking potential M is provided by the masking circuit 3 itself. Alternatively or additionally, the masking circuit 3 can also be externally provided with the masking potential M', as is indicated by the external terminal of the masking potential M' shown in dashed lines in FIG. 1.

Based on the exemplary embodiment shown in FIG. 1, an exemplary embodiment of the method according to an embodiment for controlling the operation state of the circuit IC can also be described. As was already mentioned herein, the circuit, which is configured in the present case and without limitation as an integrated circuit, is selectively operated in an active operation state and in an idle state, which is reduced in consumption compared to the former. The circuit IC is shifted from the active operation state into the idle state by means of at least one idle signal (not shown). The circuit IC is shifted in an edge-triggered manner from the idle state into the active operation state by means of the at least one wake-up signal W if the wake-up signal W executes a change in potential from the non-activation potential to the activation potential. The at least one wake-up signal W is supplied to the wake-up signal input 2 of the circuit IC with the interposition of the masking circuit 3, which passes through the at least one wake-up signal W to the wake-up signal input 2 in the idle state of the circuit IC and, in the active operation state of the circuit IC, applies to the wake-up signal input 2 a predetermined electric masking potential M or M', from which a change in potential towards the activation potential of the wake-up signal W always shifts the circuit IC from the idle state into the active operation state.

An advantageous development of the circuit assembly 1 according to another exemplary embodiment is also indicated in FIG. 1. In this case, the masking circuit 3 has a control input 4, via which the passing-through of the wake-up signal W to the wake-up signal input 2 and the application of the masking potential M to the wake-up signal input 2 is selectively controlled by means of a control signal 5. Moreover, according to this embodiment, the at least one circuit IC is configured and wired to generate the control signal 5 and supply it to the control input 4 of the masking circuit 3, as is supposed to be indicated in FIG. 1 by the dot-dashed signal line 5.

Accordingly, the passing-through of the wake-up signal W and the application of the masking potential M or M' is controlled by means of a control signal 5 which is supplied to the control input 4 of the masking circuit 3, wherein in the exemplary embodiment described in the present case, the control signal 5 is generated by the circuit IC and supplied to the control input 4 of the masking circuit 3.

Figure 2:
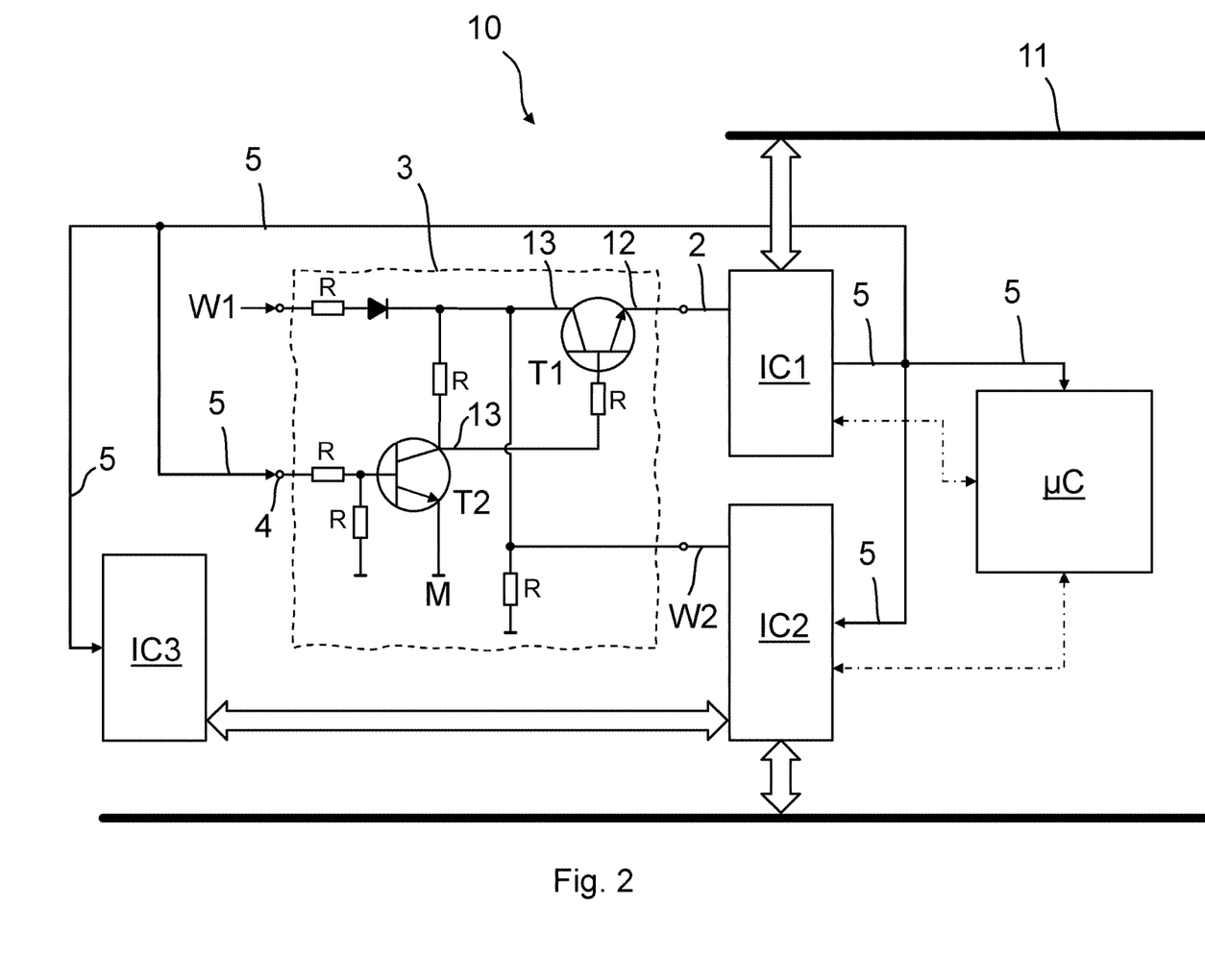

FIG. 2 shows a block circuit diagram of another exemplary embodiment of a circuit assembly 10 for controlling the operation state of at least one circuit IC1 according to an embodiment. The circuit IC1 may be substantially configured like the circuit IC from FIG. 1, and have at least the properties fundamental to the invention, such as the active operation state, the idle state, an edge-triggered wake-up function etc.

In the exemplary embodiment shown in FIG. 2, the circuit assembly 10 has at least one further, in the present case two further, circuits IC2 and IC3, for instance, which are configured as integrated circuits by way of example, without, however, being strictly limited thereto, as was already explained for the circuit assembly 1 from FIG. 1. As is shown in FIG. 2, the circuit IC1 generates a control signal 5, which is supplied both to the control input 4 of the masking circuit 5 and to the two further circuits IC2 and IC3. Additionally, the control signal 5 in the present example is designed to supply the two further circuits IC2 and IC3 with electrical energy for their operation as intended.

In other words, the control signal 5 generated by the circuit IC1 provides the internal energy supply of the circuits IC2 and IC3. It is to be understood that the circuits IC1, IC2, IC3 can additionally be provided with a permanent energy supply (not shown) in order to supply them with little energy for maintaining the wake-up functionality also during their idle state, i.e. to be able to detect a wake-up request by means of the wakeup signal at a corresponding wake-up signal input. Accordingly, the circuits IC1, IC2, IC3 can each be permanently connected to an energy source not shown in FIG. 2, e.g. a battery, an electricity grid and the like in order to ensure at least the wake-up function in the idle state. The (internal) energy supply of the circuits IC2 and IC3 provided by the control signal 5 can also be used for initiating the active operation state by further functions of the circuits IC2, IC3 being activated and provided, compared with the idle state, as soon as the internal energy supply via the control signal 5 is ready. Thus, an idle state and an active operation state of the two further circuits IC2 and IC3 can be caused by the circuit IC1 by means of the control signal 5 as an internal energy supply.

The exemplary embodiment of the circuit assembly 10 shown in FIG. 2 shows its use with, by way of example, a communication bus 11 of a vehicle not shown in more detail. The communication bus 11 may be a CAN bus, for instance, without, however, being strictly limited thereto. Other types of bus are also possible. The circuit assembly 10 shown in FIG. 2 is also not limited to the use with a communication bus or in a vehicle even though the use of the circuit assembly 10 is considered to be particularly advantageous in such applications, because multiple interdependencies of the circuits, several wake-up signals and several idle signals frequently have to be taken into account. In such applications, the multiple wake-up signals from different signal sources may, in particular, be output at different points in time, i.e. in a non-synchronized manner, as this may also be the case for the idle signals and their signal sources, whereby the probability of potential blocking states increases, as was already explained in the general part of this description.

In the example of the circuit assembly 10 shown in FIG. 2, the circuits IC1, IC2 and IC3 are bus subscribers, because they communicatively access the bus 11, as is supposed to be indicated in FIG. 2 by the broad double arrows. For example, IC1 and IC3 may be configured as CAN protocol controllers, with IC2 being configured as a CAN transceiver in the present case, forwarding the communication of the circuit IC3 with the bus 11. An architecture as shown in FIG. 2 is to be understood only to be an example; in any case not as being strictly limited to the illustrated topology with a CAN protocol controller and a CAN transceiver.

The circuits IC1, IC2, IC3 may be permanently supplied with energy by means of a vehicle battery (not shown).

Furthermore, an electronic control unit μC, which may be configured as a microcontroller, for instance, without having to be strictly limited to a microcontroller, however, is also apparent from the circuit assembly 10 from FIG. 2. Other processor/control units, such as a microprocessor, signal processor and the like, may also be used. In the present case, the control unit μC is also supplied with electrical energy via the control signal 5, as is apparent from FIG. 2. Moreover, the control unit μC may be connected in a controlling and/or monitoring function to one or several of the circuits IC1, IC2, IC3 via control and/or status lines, as is supposed to be indicated in FIG. 2 for the circuits IC1 and IC2, as an example, by means of dot-dashed double arrows connecting the control unit μC.

As was already described with respect to the circuit assembly 1 from FIG. 1, at least the circuit IC1, preferably also the circuits IC2 and/or IC3, can also be shifted by means of at least one idle signal (not shown) from the active operation state into the idle state and can be shifted by means of at least one wake-up signal, e.g. the wake-up signal W1 from FIG. 2, in an edge-triggered manner from the idle state into the active operation state.

In the exemplary application shown in FIG. 2, the idle signal and the wake-up signal W1 may be a switched ignition start signal of the vehicle (i.e. ignition on/off) in a vehicle. In addition, idle and/or wake-up signals may in the present case also be transmitted as bus messages via the bus 11 and received by the corresponding circuit IC1, IC2 and/or IC3 in order to cause a corresponding change in the operation state. Such idle/wakeup signals may be generated by different signal sources at different, non-synchronized points in time. In this case, delay times of a few milliseconds up to about 0.5 s to 3 s or about 1 s to 2 s are possible.

It may be remarked that at least one of the further circuits IC2, IC3 may additionally or alternatively be supplied with the control signal 5 also at its wake-up signal input (not explicitly shown). In this case, the control signal 5 is generated by a different circuit—in the present case by the circuit IC1, for instance. For example, the control signal 5 is supplied in the exemplary embodiment shown in FIG. 2 to a wake-up signal input of the circuit IC3, without, however, being strictly limited thereto.

In the exemplary embodiment of the circuit assembly 10 shown in FIG. 2, the further circuit IC2 is additionally configured and wired to generate, depending on its operation state (i.e. active or idle), an operation state signal and supply it to the masking circuit 3 as a wake-up signal W2. In the present case, the masking circuit 3 may be supplied on the input side with two wake-up signals W1 and W2 in parallel. More than two wakeup signals are also conceivable. Preferably, the operation state signal generated by the circuit IC2, i.e. the wake-up signal W2, has the non-activation potential of the wakeup signal W1 when the further circuit IC2 is in the idle state, and otherwise the activation potential of the wake-up signal W1 if the circuit IC2 is in the active operation state. For example, the active operation state may be present if the circuit IC2 is supplied with energy via the control signal 5; otherwise, the circuit IC2 switches over into the idle state. In this case, it might be advantageous if, during the change into the idle state, the operation state signal of the circuit IC2 is actively outputted for a predetermined time (e.g. a few milliseconds) longer than the control signal 5, which is already signaling the idle state and which has already ceased the energy supply. This is possible if at least the circuit IC2 is connected to the permanent energy supply. In this way, it can additionally be ensured that the circuit IC1 can only assume its idle state when at least the further circuit IC2 has definitively assumed its idle state. Otherwise, the operation state signal of the circuit IC2, which is still active during the delay time, represented as the (active) wake-up signal W2, prevents a change in the operation state of the circuit IC1 into the idle state.

Moreover, a more detailed exemplary design of the masking circuit 3 is apparent from FIG. 2. It can be seen, in particular, that the exemplary masking circuit 3 has a first transistor component T1 for passing through the wake-up signals W1, W2 to the wakeup signal input 2 of the circuit IC1 and for applying the masking potential M, which in the present case is predetermined as ground potential (GND) without being strictly limited thereto, to the wake-up signal input 2. The switched output terminal 12 of the first transistor component T1 is connected to the wake-up signal input 2 of the circuit IC1. The wake-up signals W1, W2 are supplied at the switched input terminal 13 of the first transistor component T1. On the control side, the first transistor component T1 is connected to a switched terminal 13 of a second transistor component T2 controlled by means of the control signal 5. Depending on the control signal 5, the second transistor component T2 provides at its switched terminal 13 either the wake-up signal W1 or W2 or the masking potential M.

Figure 3:
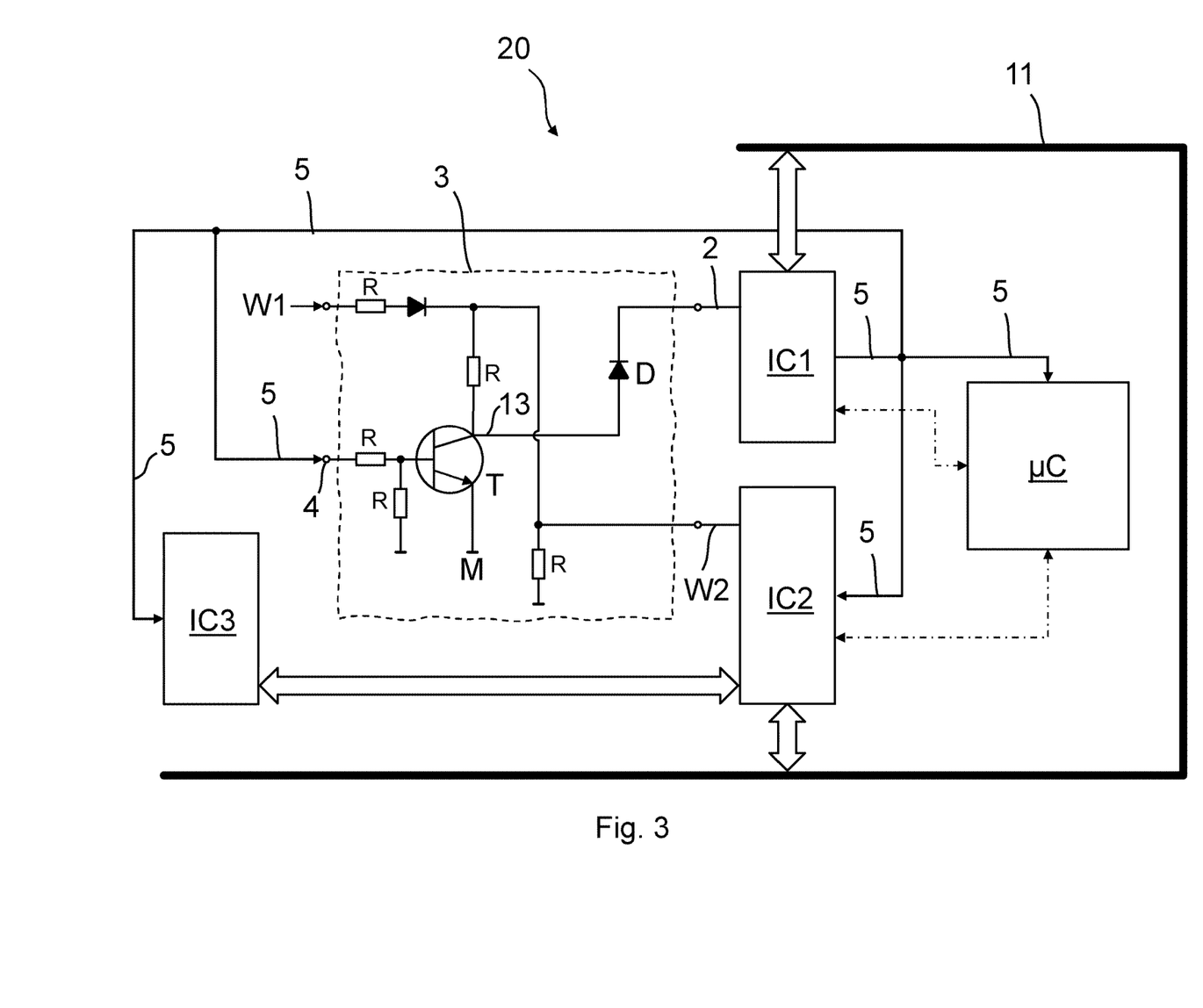

FIG. 3 shows a block circuit diagram of yet another exemplary embodiment of a circuit assembly 20 for controlling the operation state of at least one circuit IC1 according to an embodiment. The essential difference of the circuit assembly 20 from FIG. 3 to the circuit assembly 10 shown in FIG. 2 lies in the specific design of the masking circuit 3. It can be seen in FIG. 3 that the masking circuit 3 has a diode component D, which is connected on the output side with the wake-up signal input 2 of the circuit IC1, for passing through the wake-up signals W1, W2 to the wake-up signal input 2 of the circuit IC1 and for applying the masking potential M (in the present case the ground potential, GND) to the wake-up signal input 2. On the input side, the diode component D is connected to a switched terminal 13 of a transistor component T controlled by means of the control signal 5, which provides either the wake-up signal W1 or W2 or the masking potential M at the switched terminal 13.

The circuit assembly according to an embodiment and the method for controlling the operation state of a circuit disclosed herein are not limited to the specific embodiments respectively described herein, but also include further embodiments having the same effects, which result from technically viable other combinations of the features of all subject matters of the present disclosure described herein. In particular, the features and combinations of features mentioned above in the general description and the description of the Figures and/or shown in the Figures alone can be used not only in the combinations explicitly specified herein, but also in other combinations or on their own, without departing from the scope of the present invention.

In an embodiment, the circuit assembly is used in a communication bus (e.g. a CAN bus) of a vehicle, wherein the at least one circuit is communicatively connected as a bus subscriber to the communication bus and can be shifted by means of at least one idle signal from the active operation state into the idle state and can be shifted by means of at least one wake-up signal in an edge-triggered manner from the idle state into the active operation state, wherein the at least one idle signal and the at least one wake-up signal have a switched ignition start signal of the vehicle and/or a predetermined bus message.

REFERENCE SIGNS LIST

1 Circuit assembly
2 Wake-up signal input
3 Masking circuit
4 Control input
5 Control signal
10 Circuit assembly
11 Communication bus
12 Switched output terminal
13 Switched input terminal
20 Circuit assembly
D Diode component
IC Integrated circuit
IC1 Integrated circuit
IC2 Integrated circuit
IC3 Integrated circuit
µC Electronic control unit
M Masking potential
R Ohmic resistor
S1 Switching state in idle state
S2 Switching state in active operation state
T Transistor component
T1 Transistor component
T2 Transistor component
W Wake-up signal
W1 Wake-up signal
W2 Wake-up signal

The invention claimed is:

1. A circuit assembly for controlling an operation state of a circuit wherein the circuit is adapted to selectively be operated in an active operation state and an idle state, wherein the idle state is reduced in consumption compared to the active operation state, wherein the circuit is adapted to be shifted by at least one idle signal from the active operation state into the idle state and is adapted to be shifted by at least one wake-up signal in an edge-triggered manner from the idle state into the active operation state if the wake-up signal executes a change in potential from a non-activation potential to an activation potential, wherein the at least one wake-up signal is supplied to a wake-up signal input of the circuit with the interposition of a masking circuit, which passes through the at least one wake-up signal to the wake-up signal input in the idle state of the circuit and, in the active operation state of the circuit, applies to the wake-up signal input a predetermined electric masking potential, from which a change in potential towards the activation potential of the wake-up signal shifts the circuit from the idle state into the active operation state.

2. The circuit assembly according to claim 1, wherein the masking circuit has a control input via which the passing-through of the wake-up signal and the application of the masking potential is selectively controlled by a control signal, wherein the at least one control signal is configured and wired to generate the control signal and supply it to the control input of the masking circuit.

3. The circuit assembly according to claim 2, further comprising at least one further circuit to which the control signal is supplied, wherein the control signal is configured to supply the at least one further circuit with electrical energy for an operation as intended.

4. The circuit assembly according to claim 2, further comprising at least one further circuit to which the control signal is supplied at its wake-up signal input, wherein the control signal is generated by a different circuit from that to which the control signal is supplied.

5. The circuit assembly according to claim 1, further comprising at least one further circuit which is configured and wired to generate, depending on its operation state, an operation state signal and supply it to the masking circuit as a wake-up signal.

6. The circuit assembly according to claim 2, wherein the masking circuit, for passing through the wake-up signal to the wake-up signal input of the circuit and for applying the masking potential to the wake-up signal input, has a diode component which is connected on the output side to the wake-up signal input and connected on the input side to a switched terminal of a transistor component controlled by the control signal, which provides either the wake-up signal or the masking potential at the switched terminal.

7. The circuit assembly according to claim 2, characterized in that the masking circuit, for passing through the at least one wake-up signal to the wake-up signal input of the circuit and for applying the masking potential to the wake-up signal input, has a first transistor component, whose switched output terminal is connected to the wake-up input, and to which the at least one wake-up signal is supplied at a switched input terminal, and which is connected on the control side to a switched terminal of a second transistor component controlled by the control signal, which provides either the wake-up signal or the masking potential at the switched terminal.

8. A method for controlling an operation state of a circuit which is adapted to be selectively operated in an active operation state and an idle state, wherein the idle state is reduced in consumption compared to the active operation state, wherein the circuit is shifted by at least one idle signal from the active operation state into the idle state and is shifted by at least one wake-up signal in an edge-triggered manner from the idle state into the active operation state if the wake-up signal executes a change in potential from a non-activation potential to an activation potential, wherein the at least one wake-up signal is supplied to a wake-up signal input of the circuit with the interposition of a masking circuit, which passes through the at least one wake-up signal to the wake-up signal input in the idle state of the circuit and, in the active operation state of the circuit, applies to the wake-up signal input a predetermined electric masking potential, from which a change in potential towards the activation potential of the wake-up signal shifts the circuit from the idle state into the active operation state.

9. The method according to claim 8, wherein the passing-through of the wake-up signal and the application of the masking potential is controlled by a control signal which is supplied to a control input of the masking circuit, and which is generated by the at least one circuit and supplied to the control input of the masking circuit.

10. The method according to claim 9, wherein the control signal is supplied to at least one further circuit in order to supply it, from the control signal, with electrical energy for an operation as intended.

11. The method according to claim 9, wherein the control signal is supplied to the wake-up signal input of at least one further circuit, wherein the control signal is generated by a different circuit from that to which the control signal is supplied.

12. The method according to claim 8, wherein an operation state signal is generated by at least one further circuit, in particular an integrated circuit, depending on its operation state, which is supplied to the masking circuit as a wake-up signal.

13. The method according to claim 9, wherein the at least one wake-up signal and the masking potential are selectively passed through to the wake-up signal input of the circuit via a diode component which is connected on the output side to the wake-up signal input, and to which either the wake-up signal or the masking potential is supplied on the input side via a switched terminal of a transistor component controlled by the control signal.

14. The method according to claim 9, wherein the at least one wake-up signal and the masking potential are selectively passed through to the wake-up signal input of the circuit via a first transistor component, whose switched output terminal is connected to the wake-up input, and to which the at least one wake-up signal is supplied at a switched input terminal, and to which either the wake-up signal or the masking potential is supplied on the control side via a switched terminal of a second transistor component controlled by means of the control signal.

15. A method, comprising:

using a circuit assembly with a communication bus of a vehicle, wherein at least one circuit is communicatively connected as a bus subscriber to the communication bus and is adapted to be shifted by at least one idle signal from the active operation state into the idle state and is adapted to be shifted by at least one wake-up signal in an edge-triggered manner from the idle state into the active operation state if the wake-up signal executes a change in potential from a non-activation potential to an activation potential, wherein the idle signal and the wake-up signal have a switched ignition start signal of the vehicle and/or a predetermined bus message;

wherein the circuit assembly is adapted to control an operation state of the at least one circuit, wherein the at least one circuit is adapted to selectively be operated in an active operation state and an idle state, wherein the idle state is reduced in consumption compared to the active operation state, wherein the at least one wake-up signal is supplied to a wake-up signal input of the at least one circuit with the interposition of a masking circuit, which passes through the at least one wake-up signal to the wake-up signal input in the idle state of the at least one circuit and, in the active operation state of the at least one circuit, applies to the wake-up signal input a predetermined electric masking potential, from which a change in potential towards the activation potential of the wake-up signal shifts the at least one circuit from the idle state into the active operation state.

* * * * *